United States Patent
Yang

(10) Patent No.: US 7,993,814 B2
(45) Date of Patent: Aug. 9, 2011

(54) METHOD FOR FORMING PATTERNS USING SINGLE MASK

(75) Inventor: Hyun Jo Yang, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 628 days.

(21) Appl. No.: 11/771,127

(22) Filed: Jun. 29, 2007

(65) Prior Publication Data

US 2008/0070133 A1     Mar. 20, 2008

Related U.S. Application Data

(63) Continuation-in-part of application No. 11/760,841, filed on Jun. 11, 2007, now abandoned.

(30) Foreign Application Priority Data

Sep. 19, 2006   (KR) .................. 10-2006-0090846

(51) Int. Cl.
*G03F 7/207* (2006.01)
(52) U.S. Cl. ............... 430/311; 430/5; 430/30; 430/324
(58) Field of Classification Search .................. None
See application file for complete search history.

(56) References Cited

U.S. PATENT DOCUMENTS

| | | | |
|---|---|---|---|
| 6,597,001 B1 * | 7/2003 | Yamashita et al. | 250/491.1 |
| 2003/0224252 A1 * | 12/2003 | Zhou et al. | 430/5 |
| 2004/0032581 A1 * | 2/2004 | Nikoonahad et al. | 356/237.2 |
| 2004/0081899 A1 | 4/2004 | Misaka | |
| 2006/0181691 A1 * | 8/2006 | Moukara et al. | 355/67 |
| 2006/0183030 A1 | 8/2006 | Nakao | |

FOREIGN PATENT DOCUMENTS

| | | |
|---|---|---|
| JP | 07-140642 | 6/1995 |
| JP | 2005-005489 | 1/2005 |
| KR | 10-2003-008214 | 1/2003 |
| TW | 463232 | 11/2001 |

* cited by examiner

*Primary Examiner* — Daborah Chacko-Davis
(74) *Attorney, Agent, or Firm* — Marshall, Gerstein & Borun LLP

(57) ABSTRACT

A method for forming patterns using a single mask includes: disposing a photo mask having a defined pattern, and performing an exposure process by controlling the focal length of an exposure apparatus to a focusing position to form a pattern having the same shape as the photo mask on the wafer; and using the same photo mask, and performing the exposure process by controlling the focal length of the exposure apparatus to a defocusing position to form a reverse pattern having a reversed image with respect to the pattern on the wafer.

10 Claims, 8 Drawing Sheets

METHOD FOR FORMING PATTERNS USING SINGLE MASK

CROSS-REFERENCE TO RELATED APPLICATION

The priority of Korean patent application number 10-200690846, filed on Sep. 19, 2006, the disclosure which is incorporated by reference in its entirety, is claimed.

BACKGROUND OF THE INVENTION

The invention relates to photo lithography technology and, more particularly to a method for forming patterns using a single mask that can easily form line and space patterns using the single mask.

In order to form more fine patterns according to the tendency to produce highly integrated and dense semiconductor devices, photo lithography technology which realizes high resolution has been studied and developed. The resolution (R) of an exposure apparatus is defined as the following Equation 1, wherein k1 is a process constant, $\lambda$ is an exposure wavelength, and NA is a number of lens apertures in the exposure apparatus.

$$R = k1 \frac{\lambda}{NA} \quad \text{Equation 1}$$

As shown in Equation 1, a number of lens apertures NA in the exposure apparatus must increase and the exposure wavelength $\lambda$ must decrease to obtain high resolution. In fact, the exposure wavelength used in the exposure apparatus becomes shortened by gradually shifting from I-ray (365 nm) to KrF excimer laser (248 nm) to ArF excimer laser (193 nm) to F2 (157 nm) and the like.

Meanwhile, cell transistors also have been reduced as semiconductor memory devices, for example dynamic random access memory (DRAM) devices, become more highly integrated. With the reduction in size in the cell transistors, the channel length of a gate electrode also decreases, lowering the refresh property, thereby deteriorating the devices. Among the methods for preventing characteristics of a device from deterioration, a method for extending the channel length by forming trenches for recessed channels on a substrate can be mentioned.

FIGS. 1A and 1B are diagrams illustrating a photo mask used in a process of fabricating a recessed gate according to a prior art.

Referring to FIGS. 1A and 1B, the recessed gate according to the prior art uses a mask 10 for recessed channels in a process of etching a substrate to form trenches for recessed channels on a substrate. Subsequently, a mask 20 for gate electrodes to form gate electrodes on the substrate is used. Here, the light blocking regions a and c, and the light transmission regions b and d in the FIGS. 1A and 1B are not described.

Thus, two masks are required in the process of forming a recessed gate according to the prior art. Since the process is performed by using the mask 10 for recessed channels and the mask 20 for gate electrodes respectively in the process of forming the recessed gate according to the prior art, the production cost of the masks and the total fabrication process may increase.

BRIEF SUMMARY OF THE INVENTION

Therefore, the invention has been made in view of the above problems, and provides a method for forming patterns using a single photo mask that can form two patterns using the single photo mask by controlling the focal length of an exposure apparatus in the process of transcribing a photo mask pattern to a wafer.

In accordance with one aspect, the invention provides a method for forming patterns using a single mask comprising: defining a pattern layout to be formed on a wafer; disposing a photo mask having an arbitrary pattern and performing an exposure process by controlling the focal length of an exposure apparatus to a focusing position to form a pattern having the same shape as the photo mask on the wafer; and using the same photo mask and performing the exposure process by controlling the focal length of the exposure apparatus to a defocusing position to form a reverse pattern having a reversed image with respect to the pattern on the wafer.

The method of the invention may further comprise: disposing the wafer on a wafer stage of an exposure apparatus; and measuring a focus range where image inversion of the pattern occurs during exposure while changing the focusing position of the exposure apparatus to control the focal length of the exposure apparatus, before forming the pattern having the same shape with the photo mask.

In the exposure process, it is preferable that a modified illuminating system having at least two apertures where light enters is used, and that the apertures of the modified illuminating system correspond with the orientation of the pattern.

In it preferable that the focal length does not exceed 0.7 µm.

In accordance with another aspect, the invention provides a method for forming patterns using a single mask comprising: disposing a photo mask on a semiconductor substrate where a line and space shape pattern is disposed, arranging a focal length to a correct position to transcribe a pattern having the same shape as the photo mask to the semiconductor substrate, and then performing the exposure process; and arranging the focal length of the photo mask to a defocusing position, which deviated from the correct positions to transcribe a pattern having a reversed image with respect to the photo mask to the semiconductor substrate, and then performing the exposure process.

The method of the invention may further comprise: disposing the semiconductor substrate on a wafer stage of an exposure apparatus; and measuring a focus range where image inversion of the pattern is occurred during the exposure while changing the focal length of the exposure apparatus to control the focal length of the exposure apparatus, after arranging the focal length to the correct position and before performing the exposure process.

In the exposure process, it is preferable that a modified illuminating system having at least two apertures where light enters is used, and that the apertures of the modified illuminating system correspond with the orientation of the pattern.

It is preferable that the focal length does not exceed 0.7 µm.

In accordance with yet another aspect, the invention provides a method for forming patterns using a single mask comprising: disposing a photo mask on a semiconductor substrate and controlling the focal length to a focusing position to transcribe a pattern having the same shape as the photo mask to the semiconductor substrate; performing an exposure process at the focusing position to form a photoresist pattern that defines a region where trenches for recessed channels are formed on the semiconductor substrate; forming the trenches for recessed channels on the semiconductor substrate using the photoresist pattern as a mask; depositing a semiconductor layer and a photoresist substance on the semiconductor substrate; disposing the same photo mask on the semiconductor substrate and controlling the focal length to a defocusing position to transcribe a pattern having a reversed image with respect to the photo mask to the semiconductor substrate; performing the exposure process at the defocusing position to form a reversed photoresist pattern defining gate electrodes; and etching the semiconductor layer using the reversed photoresist pattern as a mask to form the gate electrodes.

The method of the invention may further comprise: disposing the semiconductor substrate on a wafer stage of an exposure apparatus; and measuring a focus range where image inversion of the pattern is occurred during the exposure while changing the focusing position of the exposure apparatus to control the focal length of the exposure apparatus, before forming the photoresist pattern on the semiconductor substrate.

In the exposure process, it is preferable that a modified illuminating system having at least two apertures where light enters is used, and that the apertures of the modified illuminating system correspond with the orientation of the pattern.

It is preferable that the focal length does not exceed 0.7 μm.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1A:
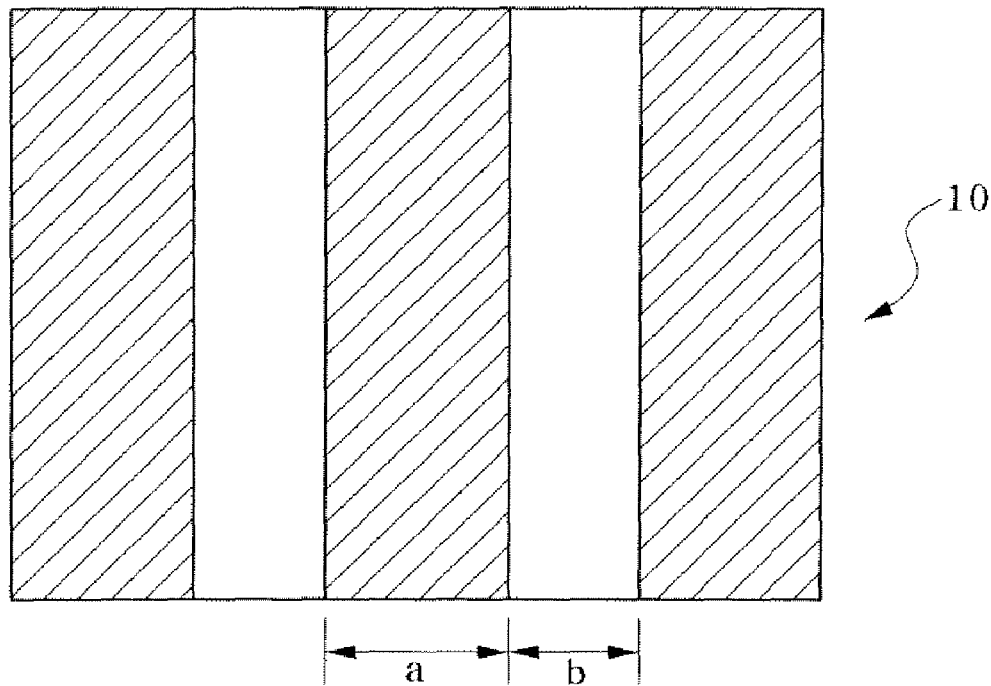
FIGS. 1A and 1B are diagrams illustrating a photo mask used in the process of fabricating a recessed gate according to a prior art.
Figure 1B:
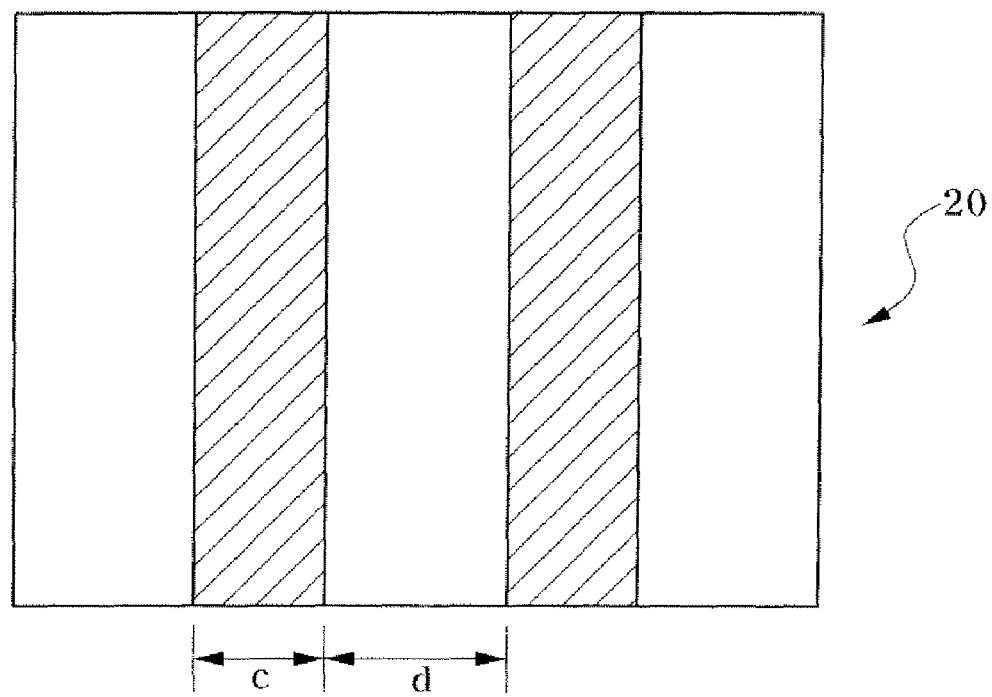

Hereinbelow, preferred embodiments of the invention are described in detail with reference to the accompanying drawings. However, the invention may be realized in various forms, and is not limited to the embodiments described herein. The thickness has been magnified to clearly illustrate a plurality of layers and regions in the drawing. The same numerical symbols have been given to the similar parts throughout the specification.

Hereinbelow, preferred embodiments of the invention are described in detail with reference to the accompanying drawings.

Figure 2:
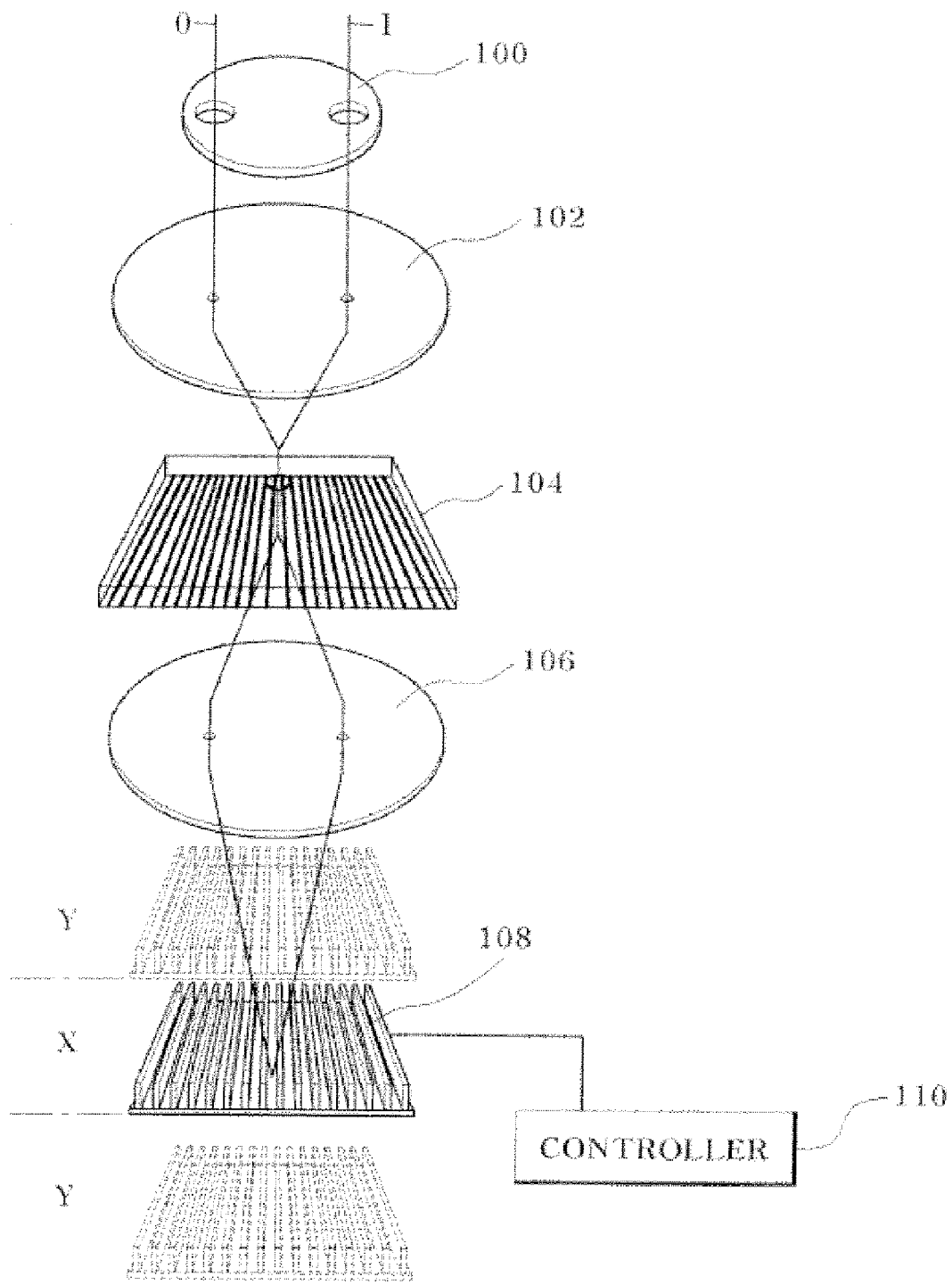
FIG. 2 is a schematic view illustrating an exposure apparatus used in forming patterns using a single mask according to the invention.

FIG. 2 is a schematic view illustrating an exposure apparatus used in forming patterns using a single mask according to the present invention.

Referring to FIG. 2, the exposure apparatus used in forming patterns using a single mask according to the invention includes apertures 100 for controlling the orientation of light and a condenser lens 102 for condensing light that passes through the apertures 100 onto a photo mask 104. The exposure apparatus also includes an objective lens 106 for forming an image by inputting the diffracted light that passes through the photo mask 104, and a stage 10S for disposing a wafer where the light having pattern information of the photo mask 104 that formed the image through the objective lens 106 is transcribed. Further, the exposure apparatus includes a controller 110 for controlling the stage 108 position to a focusing or defocusing position of the objective lens 106 and stage 108 depending on the pattern shape of a photoresist.

Here, the stage 108 can moved up or down so that the light that formed an image through the objective lens 106 is transcribed to the photoresist of the wafer from the focusing position of the focal length or the defocusing position which deviated from the focal length. Moreover, the controller 110 may also control the focusing position or the defocusing position of the objective lens 106 and the stage 108 by controlling the vertical position of the objective lens 106 up or down instead of controlling the position of the stage 108. At this time, the apertures 100 for controlling the orientation of light may use a modified illuminating system, and the apertures of the modified illuminating system that correspond with the orientation of the pattern are preferred. The modified illuminating system may include a dipole or a crosspole.

The photo mask 104 having a single pattern is disposed in the above-mentioned exposure apparatus. After controlling the focal length between the objective lens 106 and the stage 108 to a focusing position X by the controller 110, the pattern is transcribed to the photoresist of the wafer disposed on the stage 108. Thus, the photoresist may be patterned in the same shape as the pattern of the photo mask 104.

On the contrary, after controlling the focal length between the objective lens 106 and the stage 108 to a defocusing position Y which deviated from the focusing position X by the controller 110, the pattern is transcribed to the photoresist of the wafer disposed on the stage 108. Thereby, the photoresist may be patterned in a reverse pattern having reversed image with respect to the pattern of the photo mask 104.

Figure 3:
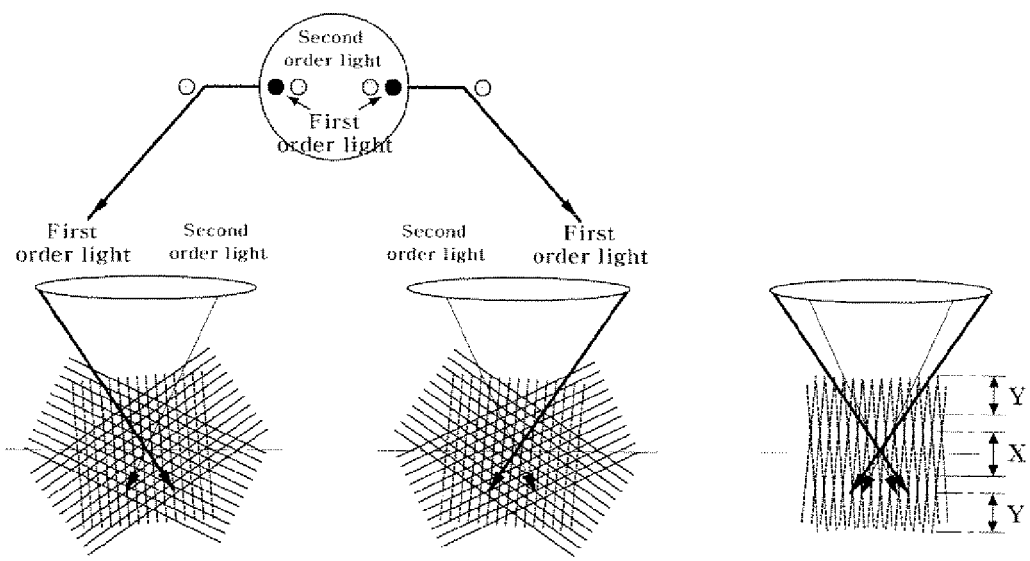
FIG. 3 is a diagram illustrating a principle of reversing the pattern using a single mask according to the invention.

FIG. 3 is a diagram illustrating a principle of reversing the pattern using a single mask according to the invention. Moreover, FIGS. 4A and 4B are diagrams illustrating a normal pattern and a reverse pattern.

Referring to FIG. 3, in the process of performing exposure using the modified illuminating system such as a dipole illuminating system, if the focal length between the objective lens and the wafer stage is not adjusted correctly, a normal pattern, which transcribes a photo mask pattern as itself on the wafer, is not formed. Especially, when the wafer stage is arranged in the defocusing position where the focal length deviates from the focusing position, image inversion is generated, that is a pattern disappears from the place where the pattern is to be formed and forms a pattern on the place where the pattern should not exist.

That is, the left side blocked light 0 and the right side blocked light 1 that transmitted through the apertures 100 (see FIG. 2) and the objective lens 102 (see FIG. 2) meet and interfere with each other. Here, a pattern is formed when the phase of zero order light and first order light are the same. In the case where the incidence angles of the zero order light and first order light are not the same, a normal pattern forms in the focusing position X of the focal length when regions having the same phase, where zero order light and first order light meet, are put together. However, a pattern having reversed image is formed with respect to the normal pattern in the upper or lower position of the focal length, namely a defocusing position Y. Here, the apertures 100 may use a modified illuminating system, and the apertures of the modified illuminating system that correspond with the orientation of the pattern are preferred. The modified illuminating system may include a dipole or a crosspole.

Figure 4A:
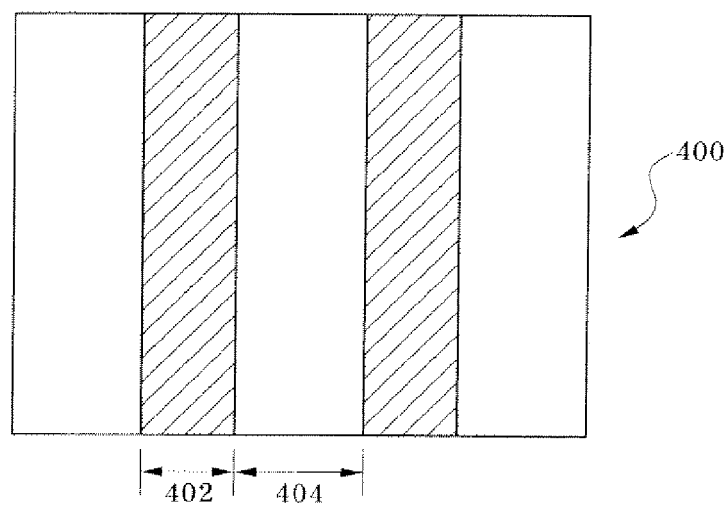
FIGS. 4A and 4D are diagrams illustrating a normal pattern and a reverse pattern.
Figure 4B:
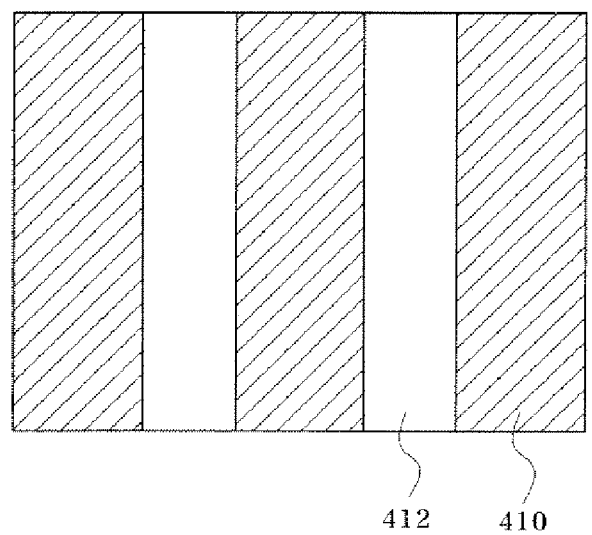

Specifically, referring to FIGS. 4A and 4B, a photo mask 400 having a line and space shape is disposed in the exposure apparatus, the focal length between the objective lens and the wafer stage is controlled to a defocusing position Y (see FIG. 2), and then the pattern is transcribed to the photoresist on the wafer. As a result, a reverse pattern 410, in which space regions 404 of the photo mask 400 become a pattern by image inversion, is formed instead of the line shape patterns 402 of the photo mask 400 being transcribed to the wafer as it is. Here, the undescribed portion in the drawing is a space portion 412 of FIG. 4B.

That is, the same line patterns as a pattern on the photo mask are formed when it is transcribed to the wafer after controlling the focal length to the focusing position X. In this regard, when the patterns are transcribed to the wafer after controlling the focal length to the defocusing position Y, space regions 412 form on the regions where the line patterns had been formed at the focusing position, and the line patterns 410 form where the space regions had been formed.

Figure 5A:
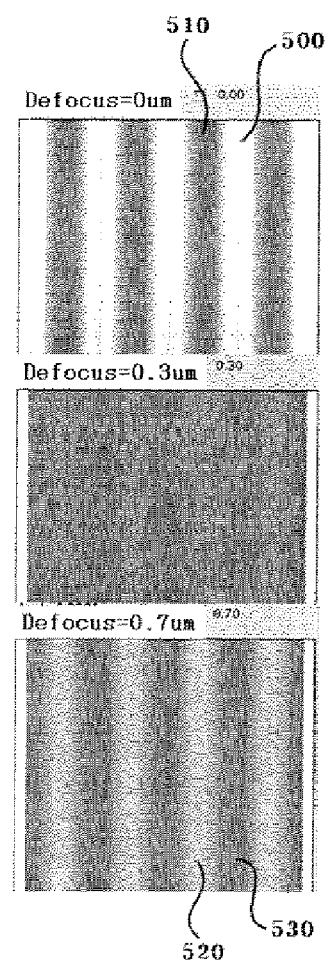
FIGS. 5A and 5B are diagrams illustrating a pattern shape formed by the defocused focal length according to the invention.
Figure 5B:
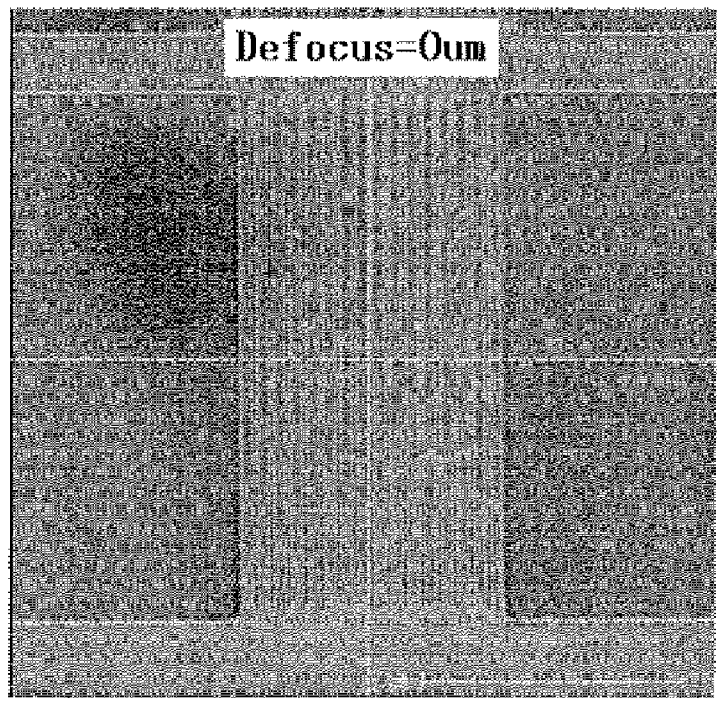
Figure 5B:
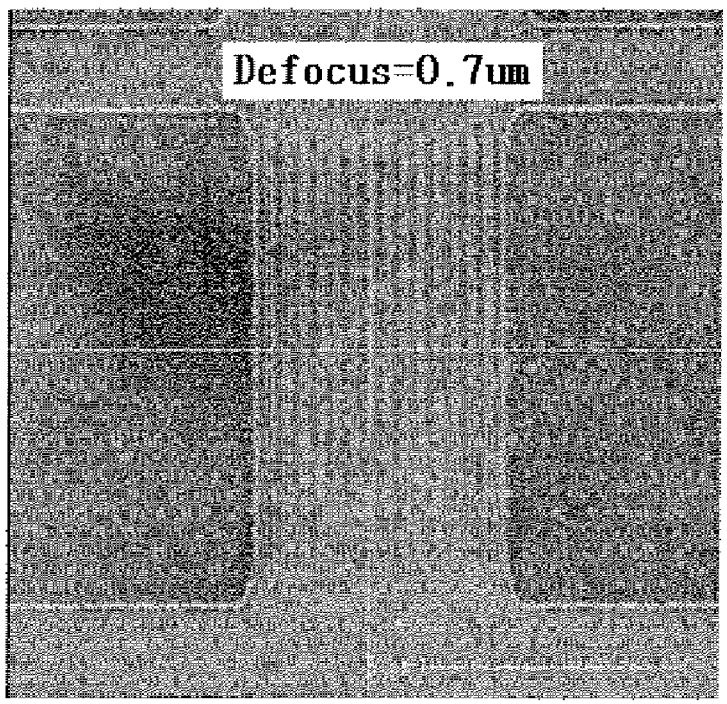

FIGS. 5A and 5B are diagrams illustrating a pattern shape formed by the defocused focal length according to the present invention. Particularly, FIG. 5A illustrates the result of the pattern simulation according to the defocused focal length (0 μm, 0.3 μm, and 0.7 μm), and FIG. 5B illustrates the experiment result according to the defocused focal length (0 μm and 0.7 μm).

Referring to FIGS. 5A and 5B, in the case where the defocused focal length of 0 μm in the exposure apparatus is set at the focusing position exactly, normal patterns 500 and spaces 510 are formed. However, in the case where the defocused focal length is 0.3 μm, pattern shape disappears. Further, in the case where the defocused focal length is 0.7 μm, it is known that reverse patterns 520 having reversed image with respect to the normal patterns 500 and spaces 530 are formed.

Accordingly, when the defocused focal length is 0.7 μm or more, the light phase reverses once more so that the reversed pattern image changes, thus desired patterns may not be formed. Therefore, it is preferable that the defocused focal length does not exceed 0.7 μm.

Figure 6:
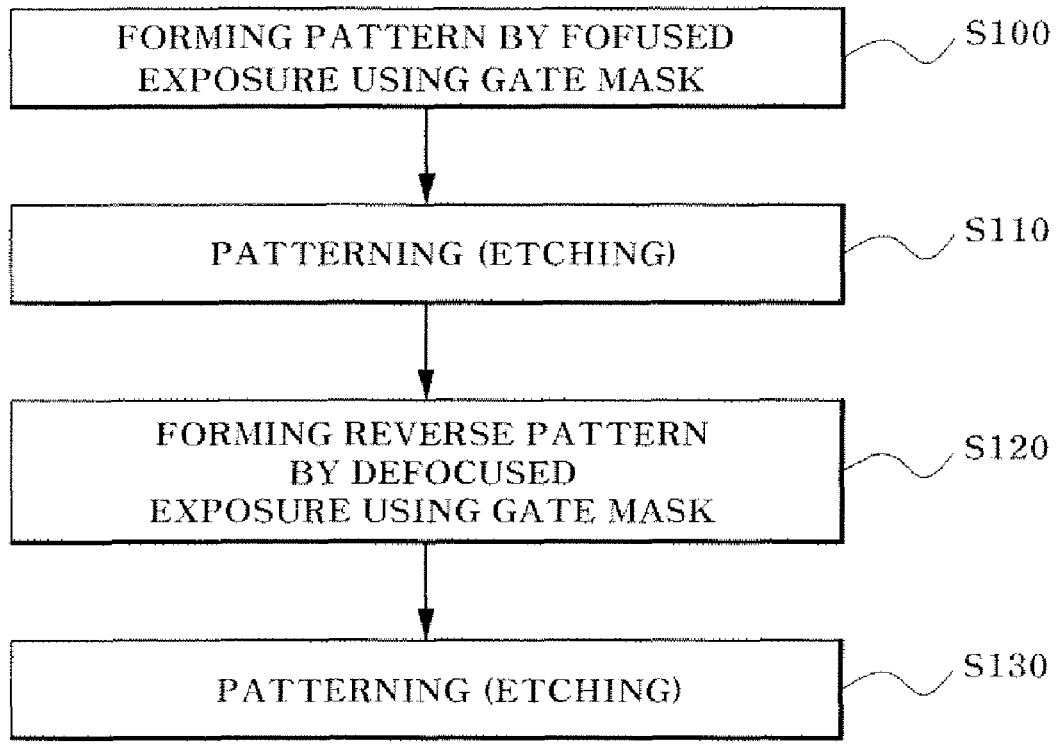
FIG. 6 is a flow chart illustrating a method for forming gate electrodes using a single photo mask according to an embodiment of the invention.

FIG. 6 is a flow chart illustrating a method for forming a gate electrode using a single photo mask according to an embodiment of the invention, and FIGS. 7A to 7D are diagrams illustrating a method for forming a gate electrode according to the present invention.

Referring to FIG. 6 and FIGS. 7A to 7D, the method for fabricating a recessed gate pattern using a single photo mask according to one embodiment of the present invention is carried out as in the following.

Figure 7A:
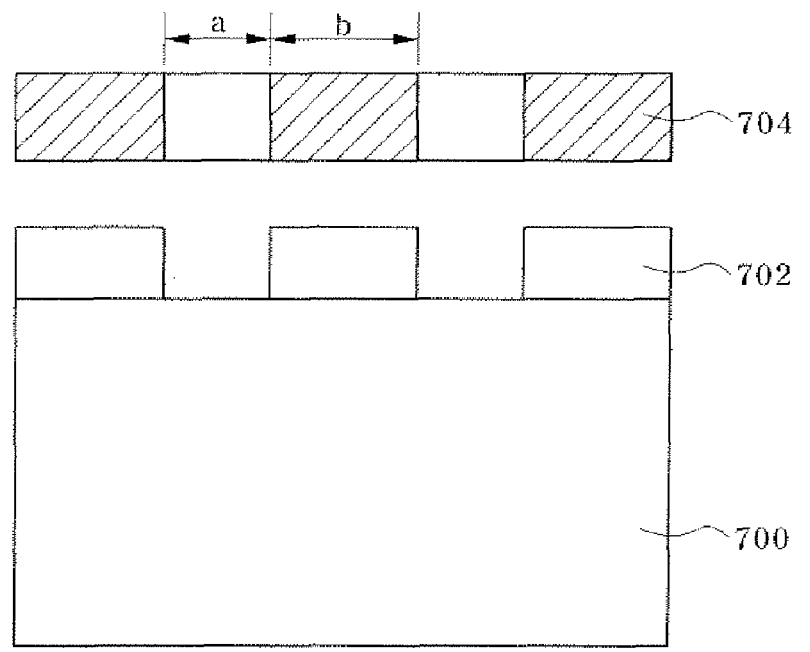
FIGS. 7A to 7D are diagrams illustrating a method for forming gate electrodes according to the invention.

Referring to FIG. 7A, a photoresist is coated on a wafer or semiconductor substrate 700, and an exposure process is performed using a photo mask 704. Here, the photo mask 704 has a line and space shape pattern formed thereon, and the pattern defines the region where trenches for recessed channels to be formed. Here, light transmission regions a and light blocking regions b of the photo mask 704 transmit and block light, respectively.

The exposure process arranges the focal length between the objective lens and stage to the focusing position X (see FIG. 2). Subsequently, the photo mask pattern is transcribed to the semiconductor substrate 700 followed by performing a development process. Thereby, the photoresist substance on the semiconductor substrate 700 transcribes the photo mask 704 pattern as it is such that the regions where light transmission regions a are transcribed exposes the semiconductor substrate 700 and the regions where light blocking regions are transcribed form photoresist patterns 702 (S100).

Figure 7B:
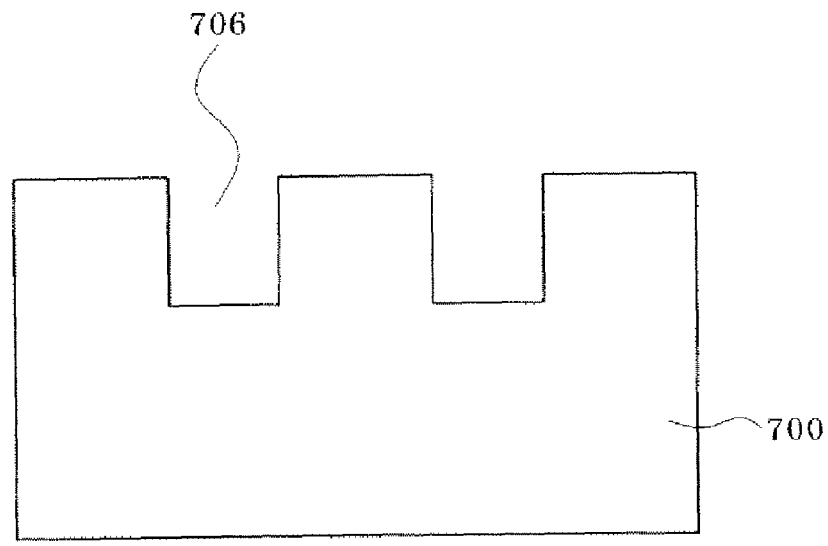

Referring to FIG. 7B, the semiconductor substrate 700 is etched to a predetermined depth using the photoresist pattern 702 as a mask to form trenches for recessed channels (S110).

Figure 7C:
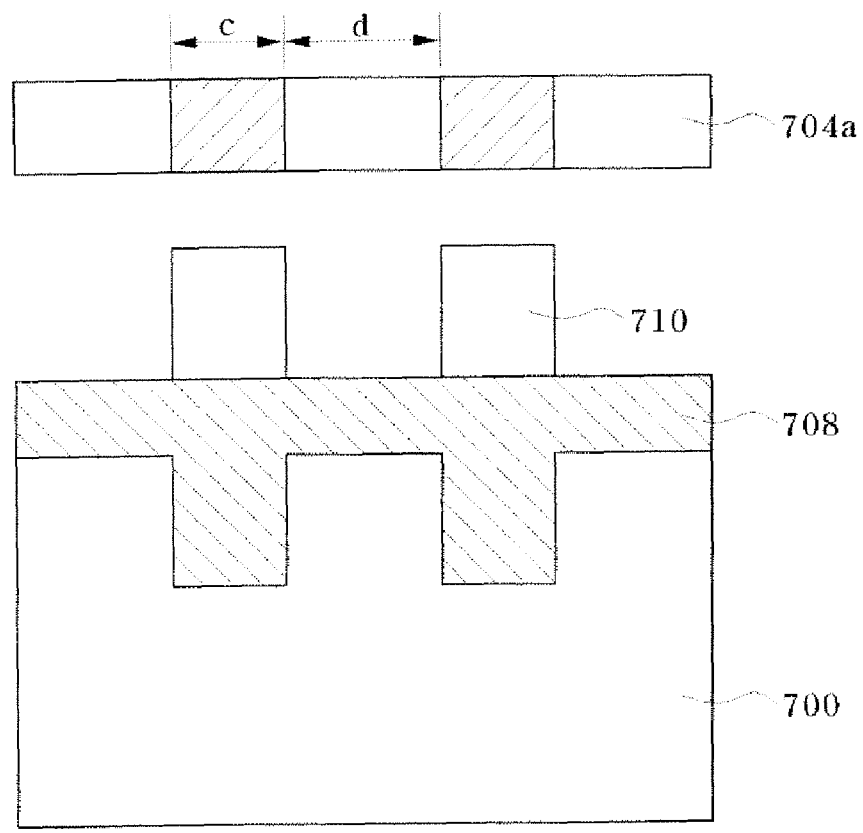

Referring to FIG. 7C, a semiconductor layer 708, for example doped polysilicon layer is deposited on the front surface of the semiconductor substrate 700, and a photoresist substance is coated on the semiconductor layer 708. Then, an exposure process is performed using a photo mask 704a. The exposure process is carried out by controlling the focal length between the objective lens and the stage to the defocusing position Y (see FIG. 2), which deviated from the focusing position, transcribing the photo mask pattern to the wafer, and then performing a development process. When the focal length is controlled to the defocusing position, which deviated from the focusing position, the photo mask 704a patterns reverse their image so that the reverse patterns are transcribed to the wafer. That is, the regions b that transcribed the photo mask 704 patterns of FIG. 7A become space regions, and the regions a that transcribed the space regions transcribe the line patterns. As a result, photoresist patterns 710 reversed from the line patterns of the photo mask 704 are formed (S120).

Figure 7D:
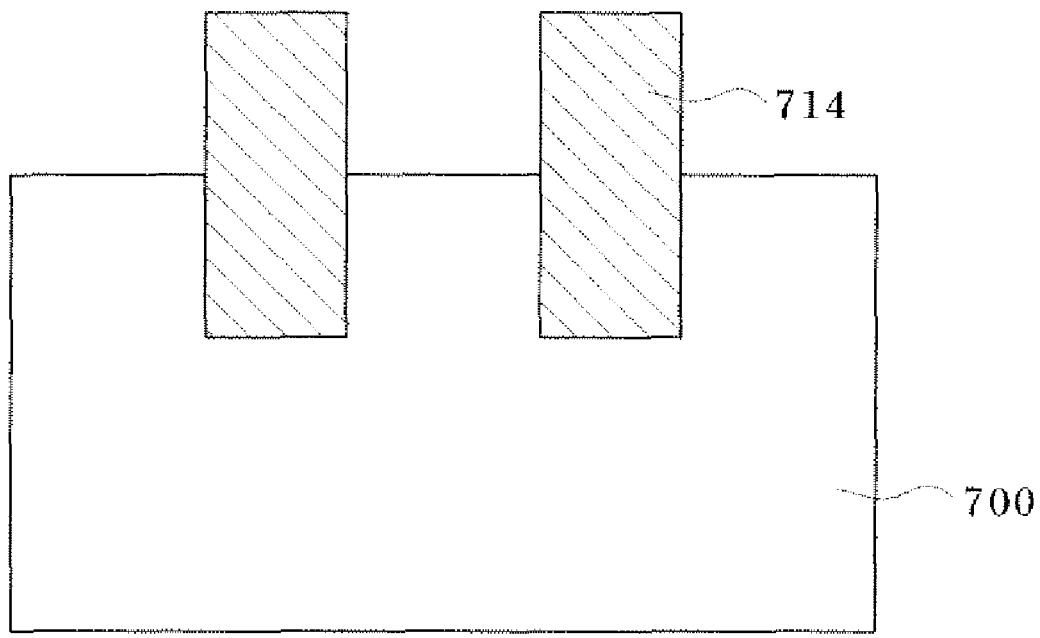

Referring to FIG. 7D, the semiconductor layer 708 is etched using the reversed photoresist patterns 710 as a mask to form gate electrodes 714 in a piled up form with trenches for recessed channels.

Thus, the method for forming patterns using a single photo mask according to the invention uses a single mask and controls the focal length of the exposure apparatus to the focusing position in the process of forming recessed gate electrodes by carrying out the exposure process twice. Thereby, patterns which transcribed the same pattern as the photo mask or reverse pattern can be fabricated.

Meanwhile, the invention is not limited to the above-mentioned embodiments. Those skilled in the art will appreciate that various modifications, additions, and substitutions are possible, without departing from the scope and spirit of the invention as defined in the accompanying claims. For example, a method for forming a recessed gate is described in the embodiment of the invention, but the part for forming line and space patterns can be applied.

As described above, the invention uses a mask having a single pattern and controls the focal length of the exposure apparatus to the focusing and defocusing position. Thereby, a normal pattern and its reverse pattern can be fabricated on the substrate when the exposure process is carried out twice.

Therefore, in the fabricating process, such as fabricating recessed gate electrodes using a normal pattern and its reverse pattern, the invention can fabricate two patterns with reversed image from each other using a single mask without using two masks. Thus the invention can reduce the mask fabricating cost and total fabricating processes.

What is claimed is:

1. A method for forming patterns using a single mask comprising:
   disposing a photo mask over a semiconductor substrate where first line shape patterns are formed on the photo mask and a first space pattern is disposed between the first line shape patterns, arranging a focal length to a focusing position;
   performing a first exposure process at the focusing position to form the first line shape patterns and the first space pattern on the semiconductor substrate;
   arranging the focal length of the photo mask to a defocusing position, which deviates from the focusing position, to transcribe a second line shape pattern and a second space pattern having a reversed image of the first line shape patterns and the first space pattern with respect to the photo mask to the semiconductor substrate; and performing a second exposure process at the defocusing position to turn the first space pattern into the second line shape pattern and to turn the first line shape patterns into the second space pattern on the same location where the first exposure process is performed on the semiconductor substrate.

2. The method according to claim 1 further comprising:

disposing the semiconductor substrate on a wafer stage of an exposure apparatus; and measuring a focus range where image inversion of the first line shape patterns and the first space pattern occurs during the first exposure while changing the focal length of the exposure apparatus to control the focal length of the exposure apparatus, after arranging the focal length to the focusing position and before performing the first exposure process.

3. The method according to claim 1, wherein the first and/or second exposure process uses a modified illuminating system having at least two apertures where light source enter.

4. The method according to claim 3, wherein the apertures of the modified illuminating system correspond with the orientation of the patterns formed using the single mask.

5. The method according to claim 1, wherein the focal length does not exceed 0.7 μm.

6. A method for forming patterns using a single mask comprising:

forming a first photoresist layer on a semiconductor substrate;

disposing a photo mask over the semiconductor substrate where first line shape patterns are formed on the photo mask and a first space pattern is disposed between the first line shape patterns, and controlling a focal length to a focusing position;

forming a first photoresist pattern on the semiconductor substrate that defines a trench region for recessed channels by performing a first exposure process at the focusing position to transcribe the first line shape patterns on the first photoresist layer;

forming the trenches for recessed channels in the semiconductor substrate using the first photoresist pattern as a mask;

depositing a semiconductor layer over the semiconductor substrate to fill the trenches for recessed channels;

depositing a second photoresist layer on the semiconductor layer;

disposing the same photo mask over the semiconductor substrate and controlling the focal length to a defocusing position to transcribe a second line shape pattern and a second space pattern that is a reversed image of the first line shape patterns and the first space pattern with respect to the photo mask to the semiconductor substrate;

forming a second photoresist pattern by performing a second exposure process at the defocusing position, wherein the first space pattern of the photomask is transcribed to the second line shape pattern and the first line shape patterns of the photomask is transcribed to the second space pattern at the same location where the first exposure process is performed; and etching the semiconductor layer using the second photoresist pattern as a mask to form the gate electrodes.

7. The method according to claim 6 further comprising:

disposing the semiconductor substrate on a wafer stage of an exposure apparatus; and measuring a focus range where image inversion of the pattern is occurred during the first exposure process while changing the focusing position of the exposure apparatus to control the focal length of the exposure apparatus, before forming the first photoresist pattern on the semiconductor substrate.

8. The method according to claim 7, wherein the first and/or second exposure process uses a modified illuminating system having at least two apertures where light source enter.

9. The method according to claim 8, wherein the apertures of the modified illuminating system correspond with the orientation of the patterns formed using the single mask.

10. The method according to claim 6, wherein the focal length does not exceed 0.7 μm.

* * * * *